(12) United States Patent
Fratti

(10) Patent No.: US 8,456,230 B2
(45) Date of Patent: Jun. 4, 2013

(54) ADAPTIVE FILTER WITH COEFFICIENT DETERMINATION BASED ON OUTPUT OF REAL TIME CLOCK

(75) Inventor: Roger A. Fratti, Mohnton, PA (US)

(73) Assignee: LSI Corporation, Milpitas, CA (US)

( * ) Notice: Subject to any disclaimer, the term of this patent is extended or adjusted under 35 U.S.C. 154(b) by 113 days.

(21) Appl. No.: 13/240,338

(22) Filed: Sep. 22, 2011

(65) Prior Publication Data

US 2013/0076433 A1    Mar. 28, 2013

(51) Int. Cl.
*H03B 1/00*      (2006.01)

(52) U.S. Cl.
USPC .......................................................... 327/553

(58) Field of Classification Search
USPC ................. 327/551, 552, 553, 555, 556, 557, 327/558, 559
See application file for complete search history.

(56) References Cited

U.S. PATENT DOCUMENTS

| | | | |
|---|---|---|---|
| 4,686,630 A | 8/1987 | Marsland et al. | |
| 5,053,983 A | 10/1991 | Hyatt | |
| 7,760,831 B2 * | 7/2010 | Pirzada et al. | 375/350 |
| 8,135,339 B2 * | 3/2012 | Ranson et al. | 455/24 |
| 2005/0108581 A1 | 5/2005 | Hayo et al. | |
| 2010/0030830 A1 | 2/2010 | Dokuchaev | |

FOREIGN PATENT DOCUMENTS

WO    02054625 A2    7/2002

OTHER PUBLICATIONS

E.R. Ferrara, Jr., "The Time-Sequenced Adaptive Filter," IEEE Transactions on Acoustics, Speech, and Signal Processing, Jun. 1981, pp. 679-683, vol. 29, No. 3.
V. Tresp et al., "The Neural Impulse Response Filter," International Conference on Artificial Neural Networks II, Sep. 1992, 7 pages, North Holland.
H. Sohn et al., "An Experimental Study of Temperature Effect on Modal Parameters of the Alamosa Canyon Bridge," Earthquake Engineering and Structural Dynamics, Aug. 1999, pp. 879-897, vol. 28, No. 8.
Elecraft KDSP2, "Internal DSP Filter and Real-Time Clock," www.elecraft.com, Jun. 2003, 50 pages.
"Worthopedia—Premier Price Guide: Crosley Green Bakelite Tube Clock Radio 1950's Work NR," http://www.worthpoint.com/worthopedia/crosley-green-bakelite-tube-clock-radio-1950s-works, Jan. 2007, 1 page.
D.K. Wise, "Adaptive FIR Filter Algorithms," ECEN4002/5002 DSP Laboratory, Spring 2003, 11 pages.

* cited by examiner

*Primary Examiner* — Jeffrey Zweizig
(74) *Attorney, Agent, or Firm* — Ryan, Mason & Lewis, LLP

(57) ABSTRACT

An adaptive filter implemented in a communication system transmitter or receiver has a real time clock associated therewith, and one or more coefficients of the adaptive filter are determined based at least in part on an output of the real time clock. For example, the adaptive filter may comprise a coefficient update engine and a memory for storing a plurality of sets of adaptive filter coefficients in association with respective time indicators derived from the output of the real time clock, with the coefficient update engine being configured to determine a particular one of the sets of filter coefficients for use by the adaptive filter based at least in part on one or more of the time indicators. The time indicators may comprise respective time stamps generated based on the output of the real time clock at respective times at which the corresponding sets of coefficients are determined.

20 Claims, 6 Drawing Sheets

ADAPTIVE FILTER WITH COEFFICIENT DETERMINATION BASED ON OUTPUT OF REAL TIME CLOCK

FIELD OF THE INVENTION

The present invention relates generally to communication systems and other types of systems that incorporate adaptive filtering functionality, and more particularly to adaptive filters for use in such systems.

BACKGROUND OF THE INVENTION

A wide variety of different types of adaptive filters are known. These filters include causal filters in which the filter output depends only on past and present inputs, as well as anti-causal filters in which the filter output depends only on future inputs.

In one typical arrangement, adaptive filter coefficients are updated periodically so as to reduce the error between the actual filter output signal and a desired signal or reference signal. This may involve use of a specified adaptive algorithm such as the least mean squares (LMS) algorithm, which attempts to determine filter coefficients that produce the least mean squares of the error signal.

Adaptive filters find application in numerous communication system applications, including, by way of example and without limitation, interference cancellation, linear prediction, and signal identification.

A significant drawback of conventional adaptive filtering arrangements is that in such arrangements it can often be very difficult to adapt the filter coefficients accurately and efficiently under varying operating conditions of the communication system in which those filters are implemented.

SUMMARY OF THE INVENTION

An illustrative embodiment of the invention provides an adaptive filter having an associated real time clock, with one or more coefficients of the adaptive filter being determined based at least in part on an output of the real time clock.

For example, the adaptive filter may comprise a coefficient update engine and a memory for storing a plurality of sets of adaptive filter coefficients in association with respective time indicators derived from the output of the real time clock, with the coefficient update engine being configured to determine a particular one of the sets of filter coefficients for use by the adaptive filter based at least in part on at least a subset of the time indicators. The time indicators may comprise respective time stamps generated based on the output of the real time clock at respective times at which the corresponding sets of coefficients are determined.

The adaptive filter may be implemented in a transmitter or receiver of a communication system. As a more particular example, one or more such adaptive filters may be implemented in a transceiver integrated circuit of a communication device such as a personal computer or mobile telephone.

The illustrative embodiments provide significant improvements in adaptive filtering performance by taking predictable interference or other deterministic time-based variations into account in the determination of filter coefficients.

DETAILED DESCRIPTION OF THE INVENTION

The invention will be illustrated herein in conjunction with exemplary communication systems, transmitters, receivers, associated processing circuitry and techniques for updating adaptive filter coefficients. It should be understood, however, that alternative embodiments of the invention can be implemented using a wide variety of other types of systems, system components and associated processing circuitry, and may utilize other types of coefficient updating processes based on one or more outputs of a real time clock.

Figure 1:
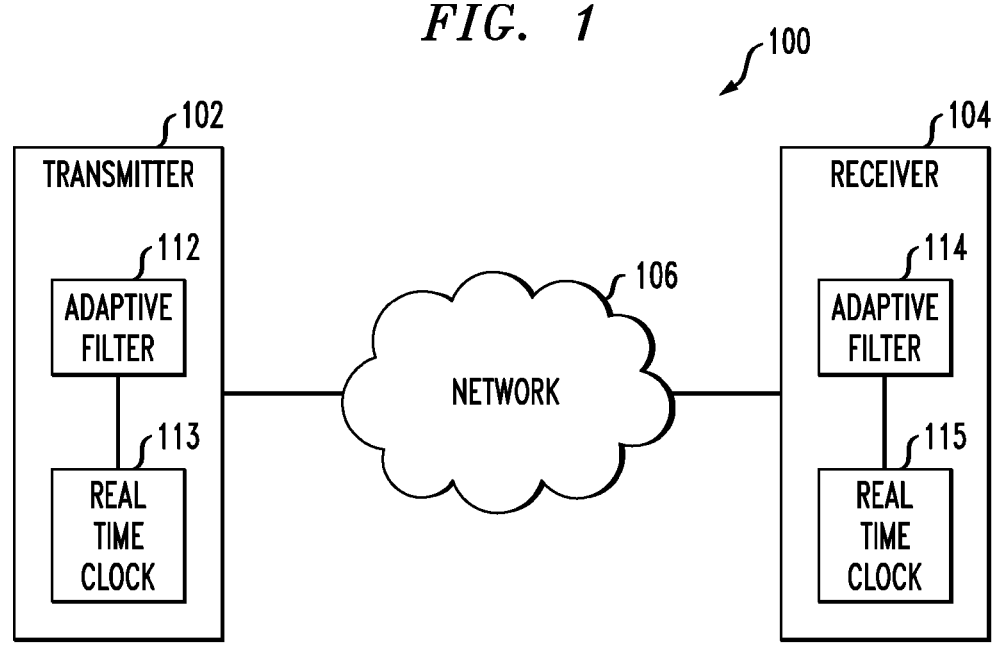
FIG. 1 is a block diagram of a communication system in an illustrative embodiment of the invention.

FIG. 1 shows a communication system 100 configured in accordance with an illustrative embodiment of the present invention. The system 100 comprises a transmitter 102 which communicates with a receiver 104 over a network 106. The transmitter 102 includes an adaptive filter 112 coupled to a real time clock 113. Similarly, the receiver 104 comprises an adaptive filter 114 coupled to a real time clock 115. Although both transmitter 102 and receiver 104 include an adaptive filter and associated real time clock in the present embodiment, in other embodiments only the transmitter or only the receiver may include an adaptive filter and associated real time clock. Also, a given such transmitter or receiver may comprise multiple adaptive filters each associated with the same real time clock.

The transmitter 102 and receiver 104 may be associated with respective communication devices or other types of processing devices that transmit and receive packets over the network 106. Such processing devices may comprise, for example, computers, servers, mobile telephones, wireless email devices or other devices, in any combination, and each such processing device may incorporate a universal time clock (UTC) or other type of real time clock that is used to control updating of adaptive filter coefficients in the manner disclosed herein. The term "real time clock" as used herein is intended to be broadly construed so as to encompass a time of day clock or other type of clock providing one or more outputs indicative of actual time within a designated time zone or relative to a known standard time. Similarly, an "output" of a real time clock should not be viewed as being restricted to any particular format, and accordingly may comprise a continuous or discrete signal, or other type of real time information.

A given processing device of the type mentioned above may comprise a transceiver that includes both transmitter and receiver functionality. Communication in the system 100 may therefore be bidirectional, although illustrated in only a single direction for the simplified diagram of FIG. 1. Conventional aspects of the operation of transceivers and other processing device components will not be described in detail herein.

The network 106 may comprise any type of packet-based network, including a wide area network such as the Internet, a metropolitan area network, a local area network, a telephony network, a cable network, a satellite network, or other type of packet-based network, as well as portions or combinations of such networks.

At least a portion of each of the transmitter 102 and receiver 104 may be implemented using processing circuitry of a corresponding processing device. Such processing circuitry may comprise at least one processor coupled to at least one memory. For example, the processing circuitry may more particularly comprise one or more of a microprocessor, a central processing unit (CPU), a microcontroller and a digital signal processor, and may be arranged in the form of one or more integrated circuits, such as an application-specific integrated circuit (ASIC), a field programmable gate array (FPGA) or other type of integrated circuit, as well as portions or combinations of such integrated circuits.

Accordingly, at least a portion of the transmitter or receiver adaptive filtering functionality described herein may be implemented in the form of software comprising executable code stored in a memory and executed by a processor within the corresponding transmitter or receiver. The memory may therefore store program code that is executed by the processor to implement at least a portion of an adaptive filtering process with real time clock based coefficient updating within the corresponding transmitter or receiver.

A processing device memory of the type described above is an example of what is more generally referred to herein as a computer-readable medium or other type of computer program product having computer program code embodied therein, and may comprise, for example, electronic memory such as RAM or ROM, magnetic memory, optical memory, or other types of storage devices in any combination. As indicated above, the processor may comprise a microprocessor, CPU, ASIC, FPGA or other type of processing device, as well as portions or combinations of such devices. It should therefore be apparent that adaptive filtering techniques in accordance with the present invention may be implemented using various combinations of hardware, software and firmware.

Figure 2:
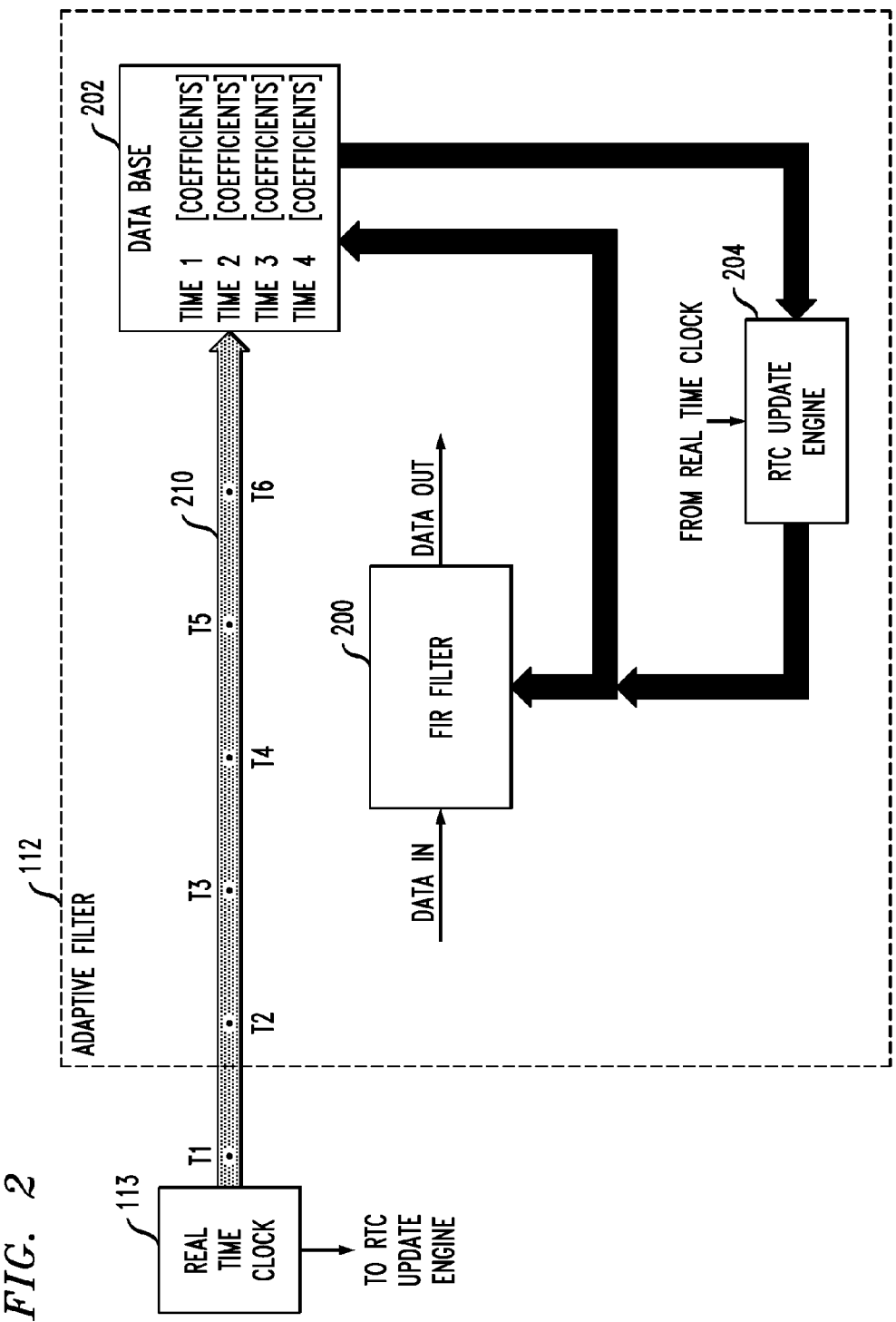
FIG. 2 illustrates one possible manner in which coefficients of an adaptive filter in the communication system of FIG. 1 may be updated based on output of a real time clock.

FIG. 2 shows a more detailed view of the transmitter 102 in the present embodiment. The transmitter includes adaptive filter 112 coupled to real time clock 113 as shown. It should be understood that the receiver 104 may be configured in a manner similar to that shown in FIG. 2 for transmitter 102. As noted above, the transmitter 102 and receiver 104 are each configured such that coefficients of its corresponding adaptive filter 112 or 114 are determined based at least in part on an output of its real time clock 113 or 114.

The adaptive filter 112 of transmitter 102 as illustrated in FIG. 2 comprises a finite impulse response (FIR) filter 200 having a data input and a data output. The data input may comprise, for example, packet data to be transmitted in a network device transmitter, baseband data to be transmitted in a radio frequency (RF) transmitter, or any other type of data that may be subject to FIR filtering in a communication system transmitter. The adaptive filter 112 further comprises a memory 202 which stores a coefficient database, and an RTC update engine 204 which updates coefficients of the FIR filter 200 based on outputs of the real time clock 113. The RTC update engine 204 may be viewed as an example of what is more generally referred to herein as a "coefficient update engine."

Although illustrated in the present embodiment using an FIR filter, adaptive filters in alternative embodiments can be implemented using other types of filters.

The real time clock 113 in the present embodiment generates outputs which illustratively include time indicators denoted T1, T2, T3, T4, T5 and T6, shown along a time line 210. The output of the real time clock may be substantially continuous, or may occur only at designated intervals, but in the present embodiment generally indicates a current time of day. Other types of real time information, using other formats, may be used in alternative embodiments. As noted above, the time of day outputs provided by the real time clock 113 may be indicative of actual time within a designated time zone or relative to a known standard time. Such outputs may be generated only upon occurrence of certain events, such as the completion of a training process involving the adaptive filter coefficients, as will be described. The time indicators generally provide sufficient information regarding time of day or other similar real time characteristics so as to permit predictive determination of filter coefficients as disclosed herein.

The memory 202 stores in its coefficient database a plurality of sets of filter coefficients in association with respective time indicators. The time indicators may more particularly comprise respective time stamps, denoted Time 1, Time 2, Time 3 and Time 4 in the figure. Associated with each of these time stamps in the coefficient database of memory 202 is a separate set of adaptive filter coefficients. The time stamps are generated based on respective outputs of the real time clock 113 at respective times at which the corresponding sets of coefficients are determined. Thus, the time stamps Time 1, Time 2 and so on in the present embodiment are indicative of the actual time of day at which the corresponding sets of coefficients were determined. This may be, for example, the particular time at which a corresponding training process used to generate the set of coefficients was completed. As another example, the time stamp associated with a given set of coefficients may indicate a time at which the training process was started, or was partially or substantially complete, rather than the time at which the training process was fully complete.

The RTC update engine 204 is configured to determine a particular set of filter coefficients for use by the adaptive filter 200 based on the output of the real time clock 113. The determination may involve operations such as selection from among a set of stored coefficients, or execution of a training process to generate a new set of coefficients.

By way of example, the RTC update engine 204 may be configured to select a particular one of the sets of stored filter coefficients for use by the adaptive filter 200 based on the output of the real time clock 113 and observed variations in the sets of stored coefficients over time.

As another example, the RTC update engine 204 may be configured to compare two or more sets of coefficients over each of a plurality of predetermined time durations, also referred to herein as look-back spans, such as one hour, one day, one week, one month, one year, etc. The RTC update engine 204 may be further configured to determine a set of coefficients for use by the adaptive filter 200 based on the output of the real time clock 113 if the comparison of the two or more sets of coefficients indicates a difference between those compared sets of coefficients above a specified threshold.

Figure 3:
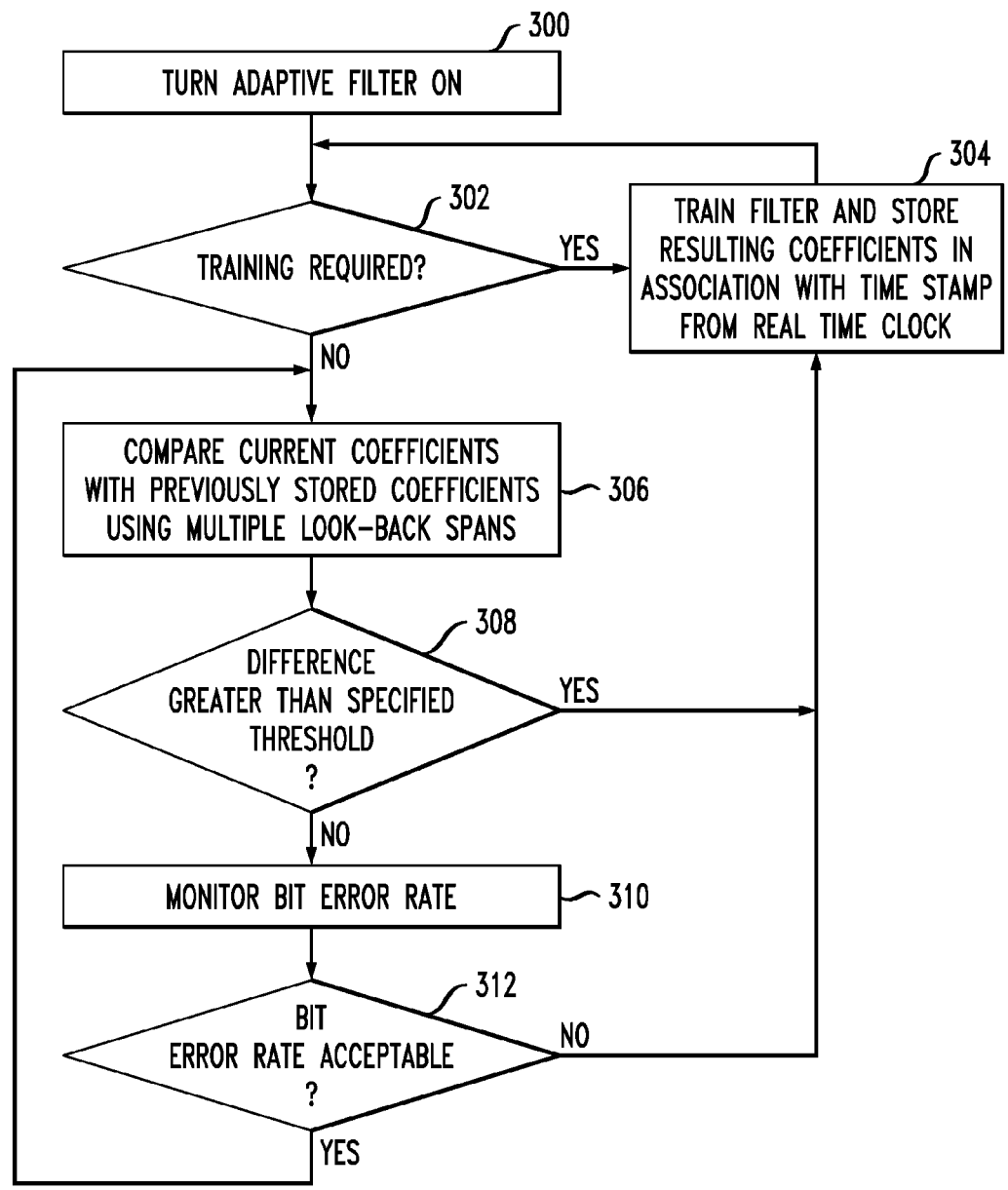
FIG. 3 is a flow diagram showing the update process of FIG. 2 in more detail.

FIG. 3 is a flow diagram showing one possible implementation of the update process of FIG. 2 in more detail. The process includes steps 300 through 312 as shown.

As will be described, the update process stores sets of coefficients in association with respective time stamps obtained from the real time clock 113. It then compares a current set of coefficients with multiple previous sets of coefficients which preceded the current set by respective time durations, also referred to as look-back spans.

In this embodiment, if a difference is above a threshold, the adaptive filter is retrained to determine a new set of filter coefficients. The adaptive filter thus predictively adapts to deterministic changes reflected in differences between the current set of coefficients and one or more previous sets of coefficients. Such adaptation in the present embodiment may be viewed as a type of anti-causal filtering, in that the filter output depends only on future inputs, reacting to anticipated deterministic changes before such changes occur.

In step 302, the adaptive filter 200 is turned on or otherwise activated. For example, it may automatically transition from an inactive mode of operation to an active mode of operation responsive to the corresponding processing device having data available to transmit over the network 106.

In step 302, a determination is made as to whether or not training of the adaptive filter is required. For example, training of the adaptive filter may be required upon an initial turn on of the filter, or upon expiration of a predetermined amount of time since a previous training of the adaptive filter.

If training is required, the process moves to step 304, where the adaptive filter is trained and the resulting coefficients are stored in memory 202 in association with a corresponding time stamp from the real time clock 113. The training may be based on the above-noted LMS algorithm or other suitable adaptive algorithm.

If training is not required, the process moves to step 306, in which a current set of coefficients is compared to one or more sets of previously-stored coefficients using multiple look-back spans. As noted above, examples of look-back spans that may be used include one hour, one day, one week, one month, one year, etc. The comparison step 306 compares the current set of coefficients with other sets of coefficients having time stamps that differ from that of the current set by the respective multiple look-back spans.

Step 308 determines if at least one difference indicated by the comparison in step 306 is greater than a specified threshold.

If the difference is greater than the threshold, the process returns to step 304 to train the adaptive filter and to store the resulting coefficients in association with a corresponding time stamp from the real time clock 113.

If there is no difference greater than the threshold, the process moves to step 310 in which the bit error rate (BER) of the system is monitored. This may be monitored at the data output of the filter 200, or elsewhere within the system 100, using well-known techniques.

If the BER monitored in step 310 is at an acceptable level, the process returns to the comparison step 306 to compare the current coefficients with other previously stored coefficients using respective multiple look-back spans. Otherwise, the process returns to step 304 to train the adaptive filter and to store the resulting coefficients in association with a corresponding time stamp from the real time clock 113.

In the FIG. 3 process, sets of coefficients of the adaptive filter 200 are stored in association with respective timestamps and then compared against each other in order to predict the need for future coefficient updates. The process therefore anticipates deterministic effects and adapts to these effects in advance. An arrangement of this type may be used as a stand-alone anti-causal filtering mechanism, or alternatively as a higher level control implemented around an otherwise conventional adaptive filter so as to provide an additional level of anti-causal or predictive correction for that adaptive filter.

It is to be appreciated that the particular process steps shown in FIG. 3 are presented by way of illustrative example only, and may be varied in other embodiments. For example, steps indicated as being performed serially in the figure may be performed at least in part in parallel with one another. Also, as indicated previously, the adaptive filters 112 and 114 of communication system 100 may be configured to support a wide variety of other types of real time clock based coefficient updating processes than that expressly described above.

Exemplary applications of the coefficient update process described above are illustrated in FIGS. 4 and 5.

Figure 4:
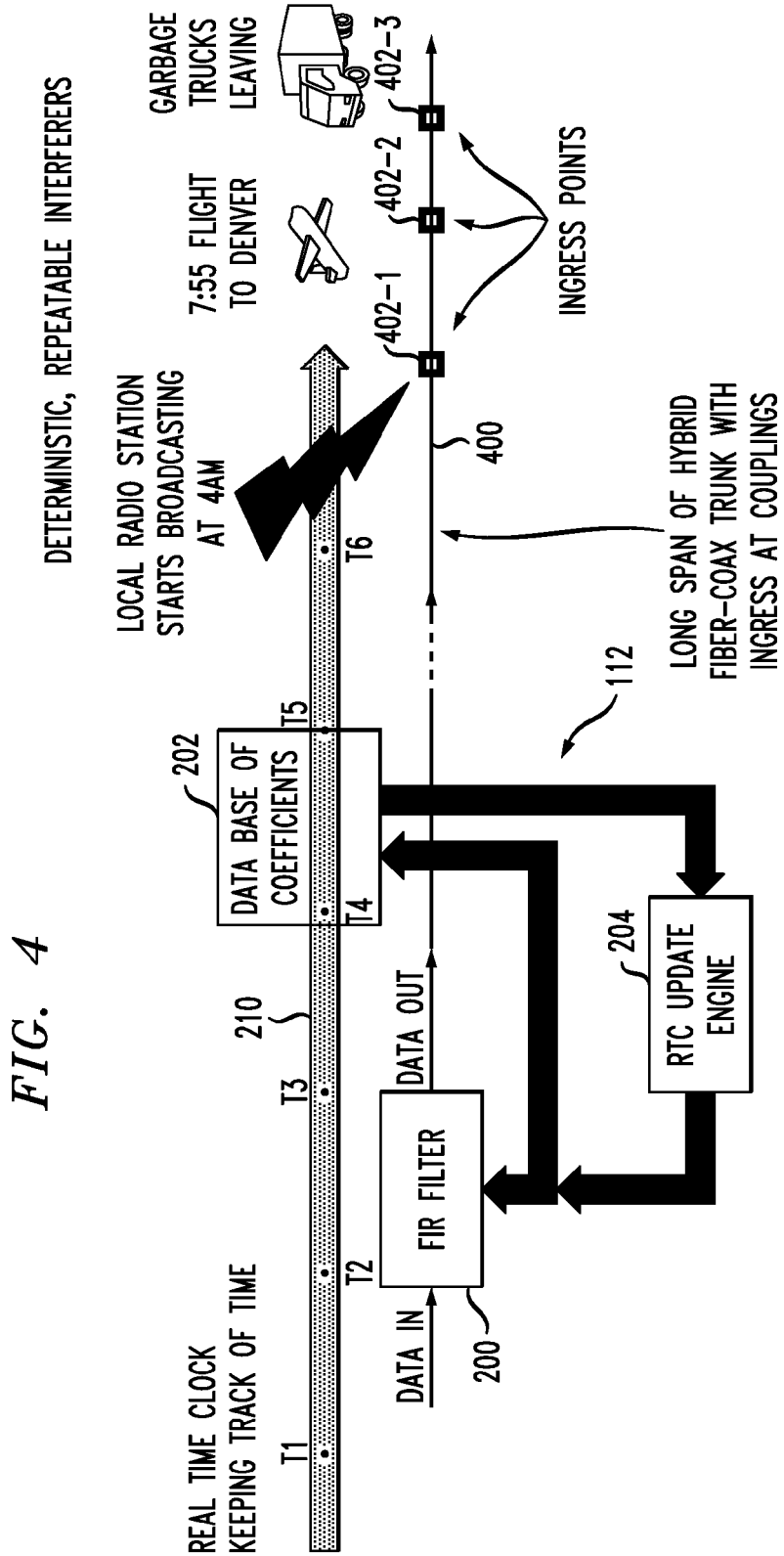
FIGS. 4 and 5 show exemplary applications of the update process of FIG. 2.

Referring initially to FIG. 4, the adaptive filter 112 of transmitter 102 in system 100 is again shown as comprising FIR filter 200, memory 202 containing a coefficient database, and RTC update engine 204. In this application, the transmitter 102 drives a long span of hybrid fiber-coax (HFC) trunk 400 in which deterministic, repeatable interferers generate abrupt interference via ingress points at respective couplings 402-1, 402-2 and 402-3. The deterministic, repeatable interferers associated with couplings 402-1, 402-2 and 402-3 include a radio broadcast (e.g., start of local radio broadcast at 4 AM), a regularly-scheduled airline flight (e.g., 7:55 flight to Denver), and road noise (e.g., garbage trucks leaving), respectively. The adaptive filter 112 in this exemplary application is advantageously configured to anticipate each of these deterministic, repeatable interferers and to correct for them by updating its set of filter coefficients in the predictive manner described previously.

Figure 5:
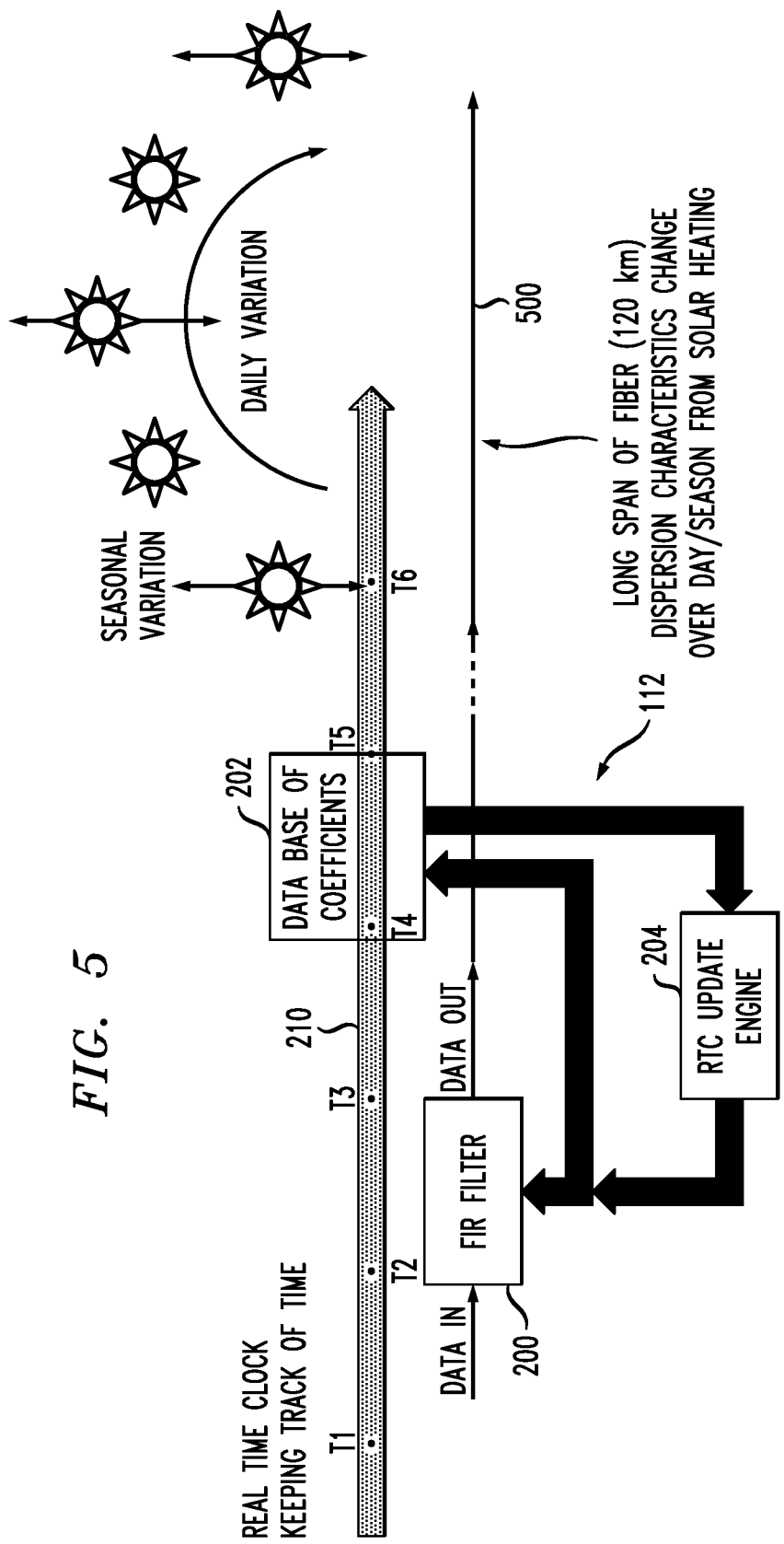

Another possible application is shown in FIG. 5, which illustrates the transmitter 102 comprising adaptive filter 112 driving a long span of fiber (e.g., 120 km of fiber). The fiber span 500 has dispersion characteristics that change in a deterministic manner over the course of a given day and in dependence upon the season, due to effects of solar heating. In a manner similar to its operation in the previous application, the adaptive filter 112 in this exemplary application is advantageously configured to anticipate these deterministic, repeatable solar heating effects on the fiber span and to correct for them by updating its set of filter coefficients in the predictive manner described previously.

Those skilled in the art will recognize that an adaptive filter with coefficient determination based on a real time clock can be applied in a much broader array of applications than those specifically noted above. For example, the adaptive filter may be used in a clock-data recovery unit, a phase locked loop, or other type of data processing circuitry. More generally, the adaptive filter can be utilized in any application in which deterministic, repeatable effects in a system can be predicted by storing sets of coefficients in association with time stamps based on outputs of a real time clock.

Illustrative embodiments of the invention as described above provide a number of significant advantages over conventional adaptive filtering techniques. For example, one or more of these embodiments can provide substantial improvements in adaptive filtering performance by taking predictable interference or other deterministic time-based variations into account in the determination of filter coefficients.

Components of communication system 100 such as transmitter 102 with adaptive filter 112 and real time clock 113 or receiver 104 with adaptive filter 114 and real time clock 115 may be implemented in the form of one or more integrated circuit devices suitable for installation on a circuit board, circuit card or other mounting structure of an otherwise conventional communication device or other type of processing device.

Figure 6:
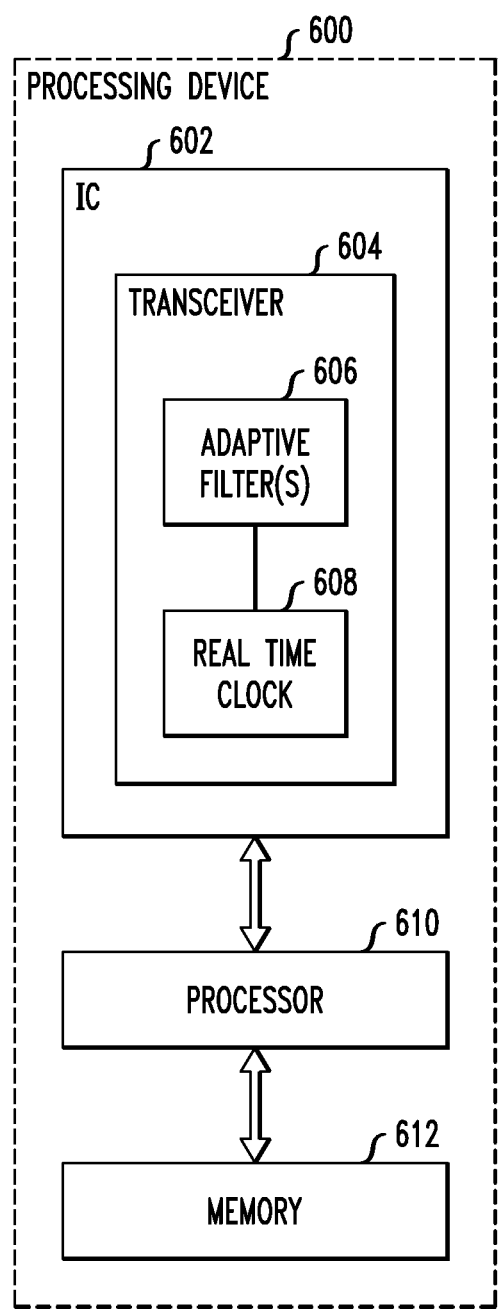
FIG. 6 is a block diagram of a processing device comprising a transceiver integrated circuit with one or more adaptive filters in an illustrative embodiment of the invention.

FIG. 6 shows an example of an arrangement of this type. In this embodiment, a processing device 600 comprises an integrated circuit 602 which implements a transceiver 604. The transceiver comprises one or more adaptive filters 606 coupled to a real time clock 608. The processing device also includes a processor 610 coupled to a memory 612. Other integrated circuit implementations may incorporate at least a portion of the processor 610 or memory 612 into the integrated circuit 602 that comprises transceiver 604.

In other examples of possible integrated circuit arrangements, the adaptive filter(s) 606 and real time clock 608 may each be implemented using a separate integrated circuit, or portions of multiple integrated circuits.

In a given such integrated circuit implementation, identical die are typically formed in a repeated pattern on a surface of a semiconductor wafer. Each die includes at least a portion of an adaptive filter as described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It should again be emphasized that the particular exemplary system and adaptive filter configurations shown in FIGS. 1, 2 and 4-6, and the processing operations shown in FIG. 3, may be varied in other embodiments. For example, different types and arrangements of transmitter and receiver circuitry may be used to implement adaptive filtering functionality based on time stamps or other outputs of a real time clock in the manner described herein. Also, other types of systems that can benefit from improved adaptive filtering may be used in implementing the invention. These and numerous other alternative embodiments within the scope of the following claims will be readily apparent to those skilled in the art.

What is claimed is:

1. An apparatus comprising:
   an adaptive filter; and
   a real time clock coupled to the adaptive filter;
   wherein one or more coefficients of the adaptive filter are determined based at least in part on an output of the real time clock.

2. The apparatus of claim 1 wherein the adaptive filter further comprises:
   a coefficient update engine; and
   a memory for storing a plurality of sets of filter coefficients in association with respective time indicators derived from the output of the real time clock;
   wherein the coefficient update engine is configured to determine a particular one of the sets of filter coefficients for use by the adaptive filter based at least in part on at least a subset of the time indicators.

3. The apparatus of claim 2 wherein the time indicators comprise respective time stamps.

4. The apparatus of claim 3 wherein the time stamps are generated based on the output of the real time clock at respective times at which the corresponding sets of filter coefficients are determined.

5. The apparatus of claim 4 wherein a given one of the sets of filter coefficients is determined using a training process and stored in the memory in association with its corresponding time stamp in conjunction with the training process.

6. The apparatus of claim 2 wherein the coefficient update engine is configured to select a particular one of the sets of filter coefficients for use by the adaptive filter based on the output of the real time clock and observed variations in the sets of stored filter coefficients over time.

7. The apparatus of claim 2 wherein the coefficient update engine is configured to compare two or more of the sets of filter coefficients over at least one predetermined time span.

8. The apparatus of claim 7 wherein the coefficient update engine is configured to determine another set of filter coefficients for use by the adaptive filter if the comparison of the two or more sets of the filter coefficients indicates a difference between said sets of compared filter coefficients above a specified threshold.

9. The apparatus of claim 1 wherein the adaptive filter comprises a finite impulse response filter.

10. An integrated circuit comprising the apparatus of claim 1.

11. A method comprising the steps of:
    receiving an output of a real time clock; and
    determining one or more coefficients of an adaptive filter based at least in part on the output of the real time clock.

12. The method of claim 11 further comprising storing a plurality of sets of filter coefficients in association with respective time indicators derived from the output of the real time clock, and wherein the determining step comprises determining a particular one of the sets of filter coefficients for use by the adaptive filter based at least in part on at least a subset of the time indicators.

13. The method of claim 12 wherein the time indicators comprise respective time stamps.

14. The method of claim 13 further comprising generating the time stamps based on the output of the real time clock at respective times at which the corresponding sets of filter coefficients are determined.

15. The method of claim 14 wherein a given one of the sets of coefficients is determined using a training process and stored in association with its corresponding time stamp in conjunction with the training process.

16. The method of claim 12 wherein the determining step comprises selecting a particular one of the sets of filter coefficients for use by the adaptive filter based on the output of the real time clock and observed variations in the sets of stored filter coefficients over time.

17. The method of claim 12 wherein the determining step comprises comparing two or more of the sets of filter coefficients over a predetermined time span.

18. The method of claim 17 wherein the determining step comprises determining another set of coefficients for use by the adaptive filter if the comparison of the two or more sets of filter coefficients indicates a difference between said sets of compared filter coefficients above a specified threshold.

19. The method of claim 15 wherein the training process is repeated and another set of filter coefficients is determined and stored in association with a corresponding time stamp responsive to a monitored bit error rate falling below a specified acceptable bit error rate.

20. A computer program product having computer program code embodied therein, wherein the computer program code when executed in a processing device causes the processing device to perform the steps of the method of claim 11.

* * * * *